(12) United States Patent
Noda et al.

(10) Patent No.: US 8,188,639 B2
(45) Date of Patent: May 29, 2012

(54) PIEZOELECTRIC ELEMENT AND METHOD FOR MANUFACTURING THE SAME

(75) Inventors: Toshinari Noda, Osaka (JP); Kazuki Komaki, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 12/994,188

(22) PCT Filed: Jun. 24, 2009

(86) PCT No.: PCT/JP2009/002883
§ 371 (c)(1),
(2), (4) Date: Nov. 23, 2010

(87) PCT Pub. No.: WO2009/157189
PCT Pub. Date: Dec. 30, 2009

(65) Prior Publication Data
US 2011/0101828 A1  May 5, 2011

(30) Foreign Application Priority Data

Jun. 27, 2008 (JP) ................................. 2008-168352
Nov. 19, 2008 (JP) ................................. 2008-295217

(51) Int. Cl.
*H01L 41/16* (2006.01)
*H01L 41/047* (2006.01)
*H01L 41/187* (2006.01)

(52) U.S. Cl. ....................................... 310/363; 310/358

(58) Field of Classification Search ............... 310/358, 310/363
See application file for complete search history.

(56) References Cited

U.S. PATENT DOCUMENTS

| 2005/0122005 A1* | 6/2005 | Higuchi et al. ............... 310/363 |
| 2007/0095653 A1 | 5/2007 | Ohashi et al. |
| 2008/0222865 A1* | 9/2008 | Nakashio et al. ............ 29/25.35 |

FOREIGN PATENT DOCUMENTS

| JP | 08-157260 A | 6/1996 |
| JP | 2001-203402 A A | 7/2001 |
| JP | 2007-119892 A | 5/2007 |
| JP | 2007-273853 A | 10/2007 |
| JP | 2007-281049 A | 10/2007 |

OTHER PUBLICATIONS

International Search Report for Application No. PCT/JP2009/002883, Jul. 21, 2009, Panasonic Corporation.

* cited by examiner

*Primary Examiner* — Thomas Dougherty
(74) *Attorney, Agent, or Firm* — RatnerPrestia (57) ABSTRACT

A piezoelectric element includes a substrate, and a lower electrode layer, a piezoelectric layer, and an upper electrode layer sequentially formed on the substrate. The substrate has a linear thermal expansion coefficient higher than that of the piezoelectric layer, and the piezoelectric layer includes a polycrystalline body having an in-plane stress in a compressive direction. Thus, the piezoelectric element realizes the piezoelectric layer having a high orientation in a polarization axis direction, high proportionality of a displacement amount with respect to an applied voltage, and a large absolute value of the displacement amount.

12 Claims, 9 Drawing Sheets

FIG. 10

PIEZOELECTRIC ELEMENT AND METHOD FOR MANUFACTURING THE SAME

THIS APPLICATION IS A U.S. NATIONAL PHASE APPLICATION OF PCT INTERNATIONAL APPLICATION PCT/JP2009/002883.

TECHNICAL FIELD

The present invention relates to a piezoelectric element having an electromechanical conversion function, and a method for manufacturing the same.

BACKGROUND ART

An oxide dielectric thin film having a perovskite structure is expressed by means of the general formula $ABO_3$, and shows excellent ferroelectricity, piezoelectricity, pyroelectricity, and electrooptical property. This attracts attention as an effective material for various kinds of devices such as sensors and actuators, and a range of its application is expected to be rapidly extended in the future. Since a lead zirconate titanate (PZT: general formula is $Pb(Zr_xTi_{1-x})O_3$ (0<x<1)) thin film serving as perovskite oxides has high piezoelectricity, it is used as a piezoelectric element such as a piezoelectric sensor or a piezoelectric actuator. The piezoelectric sensor uses a piezoelectric effect of ferroelectricity. A ferroelectric body has spontaneous polarization inside, and generates positive and negative charges on its surface. In its steady state in the air, the piezoelectric sensor combines with a charge of a molecule in the air to be in a neutral state. When an external pressure is applied to this piezoelectric body, an electric signal can be extracted from the piezoelectric body based on a pressure amount. In addition, the piezoelectric actuator also uses the same principle, and when a voltage is applied to a piezoelectric body, the piezoelectric body expands and contracts based on the voltage, and displacement can be generated in an expansion direction or a direction perpendicular to the expansion direction.

Attempts have been tried to produce the PZT thin film by a vapor-phase growth method represented by a vapor deposition method, sputtering method (sputter method), or CVD method (Chemical Vapor Deposition method), or a liquid-phase growth method represented by a CSD method (Chemical Solution Deposition method), or hydrothermal synthesis method. Among them, the CSD method is easy to control a composition, and easy to produce the thin film with high reproducibility. In addition, as a feature, the CSD method can be low in cost required for a production facility and can be mass-produced.

Figure 9:
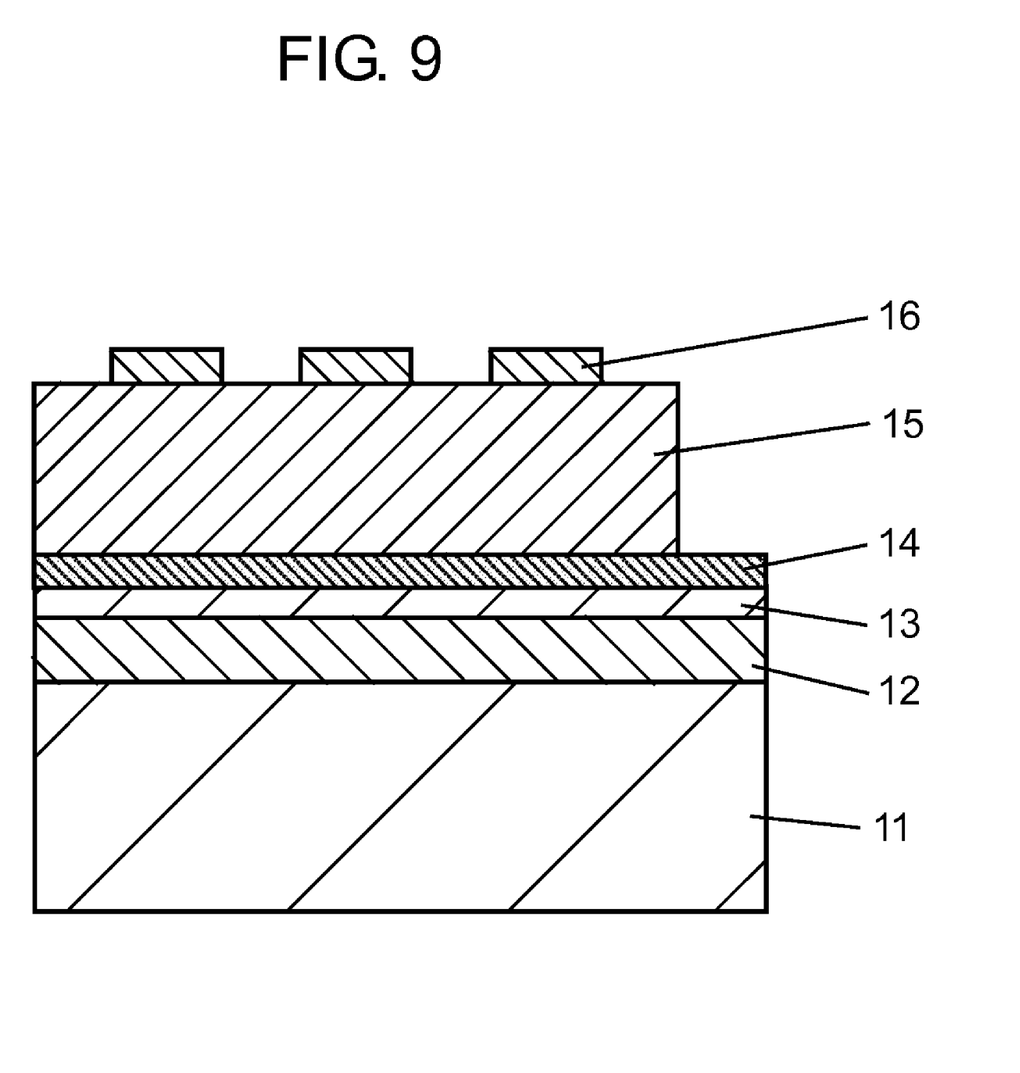
FIG. 9 is a cross-sectional view of a conventional piezoelectric element.

FIG. 9 is a cross-sectional view of a conventional ferroelectric thin film element. Referring to FIG. 9, thermally oxidized film 12 having a film thickness of 2000 Å is formed on silicon substrate 11, and Ti film 13 having a film thickness of 300 Å is formed on thermally oxidized film 12 by the sputtering method, and Pt film 14 having a film thickness of 2000 Å is also formed on Ti film 13 by the sputtering method, and these films are used as a substrate.

Hereinafter, a method for producing the conventional ferroelectric element will be described.

First, 0.1 mol of lead acetate is added to 1 mol of acetic acid and stirred at 100° C. in a nitrogen atmosphere for about 1 hour. This solution is combined with 36 ml of a solution provided by preparing titanium isopropoxide (Ti(OCH(CH$_3$)$_2$)$_4$) to be 1 mol/L with 2-methoxyethanol and 64 ml of a solution provided by preparing zirconium isopropoxide (Zr(OCH(CH$_3$)$_2$)$_4$) to be 1 mol/L with 2-methoxyethanol. This solution is further stirred at 120° C. in a nitrogen atmosphere for about 3 hours, and cooled down to room temperature and prepared to be 0.5 mol/L with 2-methoxyethanol. Furthermore, 0.2 mol of water is added to this solution and stirred for about 1 hour, and then diethanolamine is added thereto and this is used as a PZT precursor solution. Then, this precursor solution is dropped onto the substrate, and spin-coated under the condition that 350 rpm×3 seconds, and 5000 rpm×20 seconds, and dried gel is produced by a heat treatment at 100° C.×15 minutes. Then, an organic substance is thermally decomposed at 400° C.×60 minutes. These steps are repeated three times, whereby thin film 15 having a film thickness of 2000 Å is obtained. Thin film 15 is subjected to a heat treatment with an infrared rapid thermal annealing (RTA) furnace to be crystallized, whereby PZT thin film 15 is obtained. The heat treatment is performed at atmosphere pressure, in a 100% oxygen atmosphere, at an annealing temperature of 650° C. for an annealing time of 15 seconds. Upper electrode layer 16 is further formed on PZT thin film 15.

Figure 10:
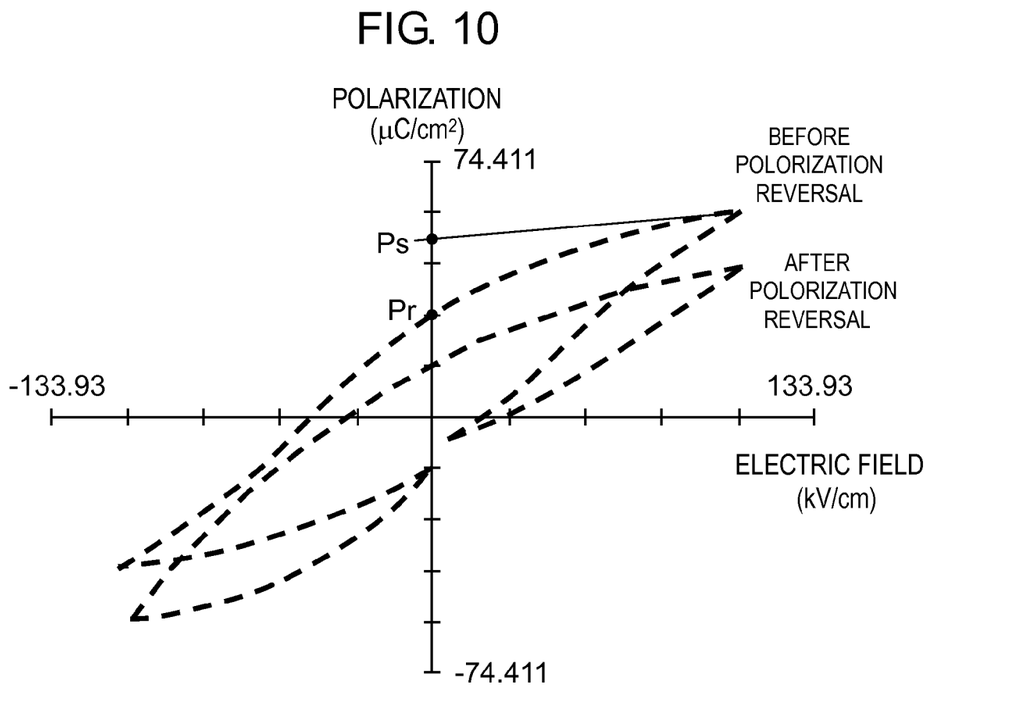
FIG. 10 is a view showing P-E hysteresis loops of the conventional piezoelectric element.

FIG. 10 is a view showing polarization-electric field (P-E) hysteresis loops of a conventional piezoelectric element. FIG. 10 shows P-E hysteresis loops showing ferroelectricity before and after repeating $10^8$ polarization inversions of PZT thin film 15 produced by the conventional method. The conventional piezoelectric element is low in linearity of a displacement amount with respect to an applied voltage. This is because a piezoelectric layer is low in crystalline orientation.

This piezoelectric layer is low in squareness M of the P-E hysteresis loop, that is, low in ratio of saturation polarization $P_s$ and remanent polarization $P_r$ expressed such that $M=P_r/P_s$, and linearity of the displacement amount is low with respect to the applied voltage. When the linearity of the displacement amount is low with respect to the applied voltage, it is difficult to control a device.

Patent document 1 is known as background art document information regarding this application of the present invention.

BACKGROUND ART DOCUMENT

[Patent Document]
[Patent document 1] Japanese Unexamined Patent Publication No. H8-157260

DISCLOSURE OF THE INVENTION

A piezoelectric element according to the present invention has a substrate, and a lower electrode layer, a piezoelectric layer, and an upper electrode layer sequentially formed on the substrate. The lower electrode layer includes a conductive oxide crystalline body, and the substrate has a linear thermal expansion coefficient higher than that of the piezoelectric layer, and the piezoelectric layer includes a polycrystalline body having an in-plane stress in a compressive direction.

Thus, according to the present invention, linearity of a displacement amount can be improved with respect to an applied voltage. This is because the piezoelectric layer is improved in crystalline orientation. More specifically, according to the present invention, since the lower electrode layer includes the conductive oxide crystalline body, it is hardly affected by a composition of the substrate, and a lattice constant of its main oriented surface can be close to a lattice constant of a main oriented surface of the piezoelectric layer.

In addition, since the substrate has the linear thermal expansion coefficient higher than that of the piezoelectric layer, a compressive stress can be applied to the piezoelectric layer in a step of forming the piezoelectric layer. As a result, orientation of the piezoelectric layer is enhanced in a polarization axis direction, and the linearity of the displacement amount can be enhanced with respect to the applied voltage.

PREFERRED EMBODIMENTS FOR CARRYING OUT OF THE INVENTION

Hereinafter, a description will be made of embodiments regarding a piezoelectric element according to the present invention and a method for producing the same, with reference to the drawings.

(Embodiment) 1

Figure 1:
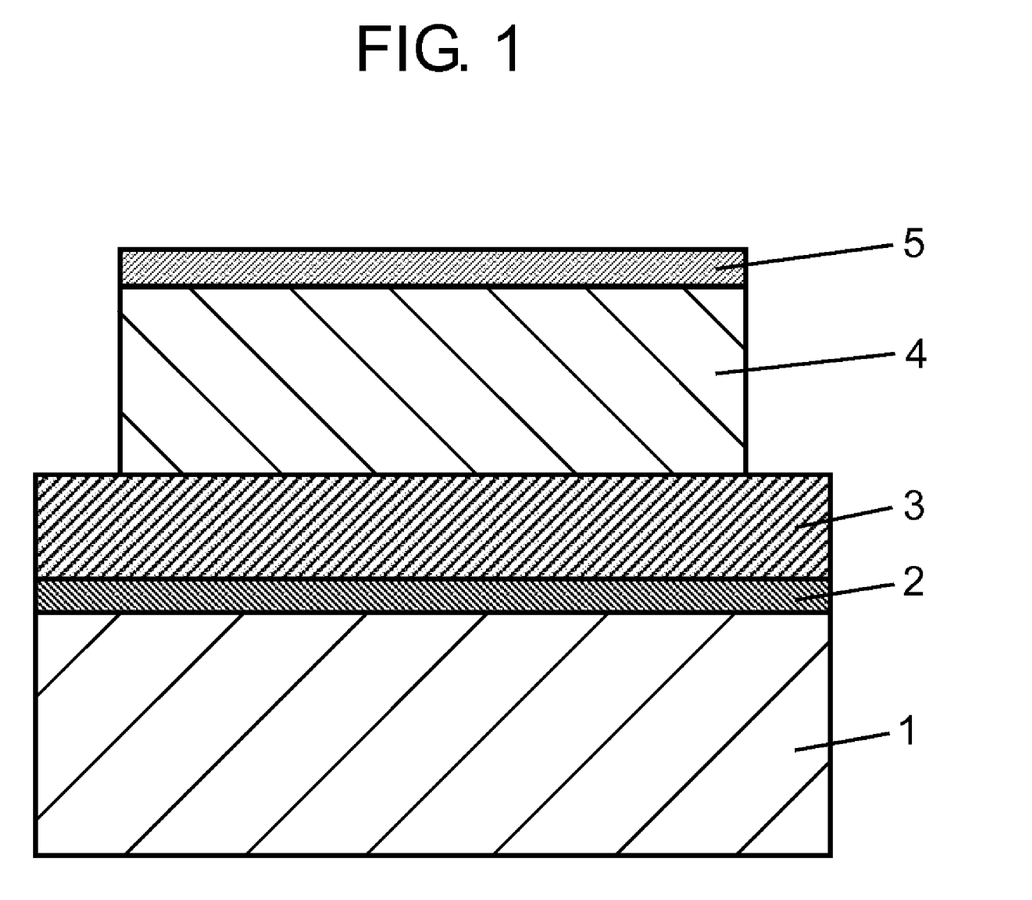
FIG. 1 is a cross-sectional view of a piezoelectric element according to an embodiment 1 of the present invention.

FIG. 1 is a cross-sectional view of a piezoelectric element according to an embodiment 1 of the present invention. Referring to FIG. 1, the piezoelectric element includes substrate 1, and diffusion prevention layer 2, lower electrode layer 3, piezoelectric layer 4, and upper electrode layer 5 sequentially formed on substrate 1.

Substrate 1 can include a material having a linear thermal expansion coefficient and fracture toughness higher than that of piezoelectric layer 4. For example, substrate 1 can include various kinds of materials such as a stainless steel material or a metal material such as aluminum or magnesium.

Diffusion prevention layer 2 is provided to suppress mutual diffusion between components of substrate 1 and piezoelectric layer 4, and preferably includes an oxide material having no crystal grain boundary of silicon dioxide or titanium dioxide.

Lower electrode layer 3 includes a material mostly including lanthanum nickel oxide (LNO: Chemical formula is $LaNiO_3$). Lanthanum nickel oxide has a R-3c space group, and has a perovskite structure distorted in the form of a rhombohedron (rhombohedral system: a0=5.461 Å (a0=ap), α=60°, pseudo-cubic system: a0=3.84 Å). LNO is an oxide having metallic electric conductivity and has resistivity of $1 \times 10^{-3}$ (Ω·cm, 300 K) and has a feature of not causing metal-insulator transition even when a temperature is changed.

A material mostly including LNO includes a material in which a part of nickel is replaced with other metal. For example, the material includes $LaNiO_3$—$LaFeO_3$ replaced with iron, $LaNiO_3$—$LaAlO_3$ replaced with aluminum, $LaNiO_3$—$LaMnO_3$ replaced with manganese, and $LaNiO_3$—$LaCoO_3$ replaced with cobalt.

Piezoelectric layer 4 includes (001)-oriented PZT having a rhombohedral system or a tetragonal system. A composition of PZT is a composition (Zr/Ti=53/47) in the vicinity of a boundary (Morphotropic phase boundary) between the rhombohedral system and the tetragonal system. In addition, the Zr/Ti composition of piezoelectric layer 4 is not limited to Zr/Ti=53/47, but may be Zr/Ti=30/70 to 70/30. In addition, the component of piezoelectric layer 4 may only have to be a perovskite oxide ferroelectric body mostly including PZT such as the one containing an additive such as Sr, Nb, or Al, or may be PMN (lead magnesium niobate), or PZN (lead zinc niobate).

In addition, piezoelectric layer 4 is preferably provided such that a surface vertical to substrate 1 is preferentially oriented in a polarization axis, and a surface parallel to substrate 1 is randomly oriented. Thus, its structure is small in elasticity, and high in fracture toughness, and suitable for a device oscillating repeatedly such as an actuator.

Here, PZT of the tetragonal system used in the embodiment 1 is a material having a lattice constant such that a=b=4.036 Å, c=4.146 Å. Therefore, LNO of the pseudo-cubic structure having a lattice constant such that a=3.84 Å has good lattice matching with PZT. The lattice matching means lattice consistency between a unit lattice of PZT and a unit lattice of the surface of LNO. In general, it is reported that when a certain kind of crystal surface is exposed to a surface, its crystal lattice tries to match with a crystal lattice of a film formed thereon, and an epitaxial crystal nuclear is likely to be formed in a boundary between the substrate and the film.

In addition, when a difference in lattice constant between a main orientated surface of piezoelectric layer 4 and a main orientated surface of lower electrode layer 3 is within ±10%, the orientation in a (001)/(100) direction of piezoelectric layer 4 can be enhanced. Thus, the epitaxial crystal nuclear can be formed in the boundary between the substrate and the film.

A polycrystalline film which is preferentially oriented in a (100) direction can be formed on the various kinds of substrates by producing LNO by the following method. Therefore, LNO functions not only as the lower electrode layer, but also as an orientation control layer of piezoelectric layer 4. Thus, a (001) surface and a (100) surface of PZT (lattice constant: 4.036, c=4.146 Å) can be selectively formed so as to have the good lattice matching with a (100) oriented LNO surface (lattice constant: 3.84 Å). In addition, since the LNO thin film of lower electrode layer 3 has a polycrystalline structure, a PZT thin film formed thereon has also a polycrystalline structure.

When the CSD method is used in a step of producing piezoelectric layer 4, an annealing step is needed at the time of film formation. Since PZT is crystallized and reoriented at high temperature, a compressive stress is left at the time of cooling to room temperature due to a difference in thermal expansion coefficient from that of substrate 1. When it is assumed that SUS304 of austenitic stainless steel defined in JIS (Japanese Industrial Standard) is used as substrate 1, a linear thermal expansion coefficient of SUS304 is $173 \times 10^{-7}$/°C. Since a linear thermal expansion coefficient of PZT is $79 \times 10^{-7}$ °C., and SUS304 has the higher linear thermal expansion coefficient, PZT has a residual compressive stress in the in-plane direction. According to the embodiment 1, the compressive stress is left in piezoelectric layer 4, and when it is assumed that the side of upper electrode layer 5 is an upper surface and the side of substrate 1 is a bottom surface, the piezoelectric element has a structure having a projection on the upper surface side.

Figure 2:
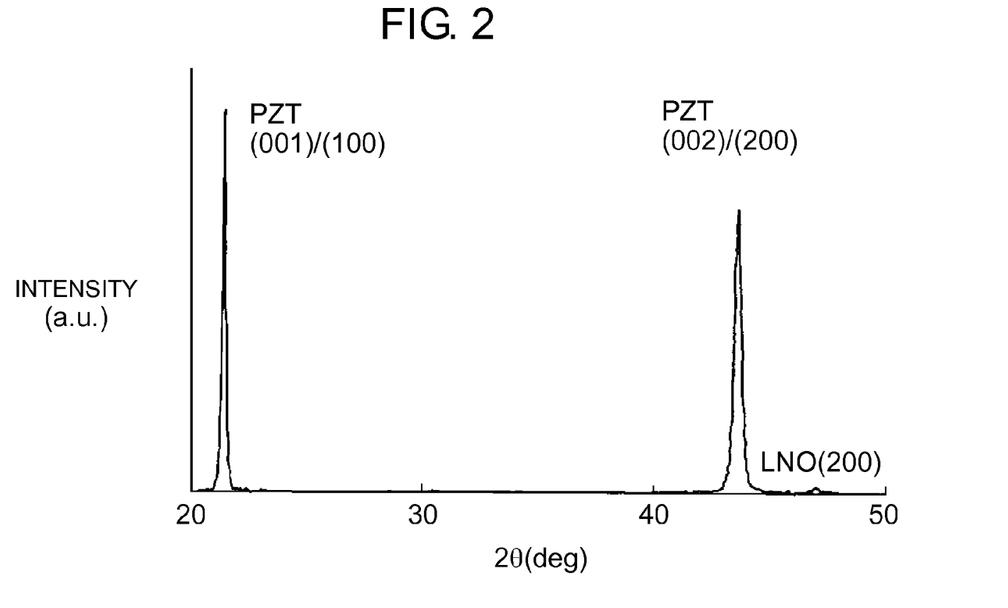
FIG. 2 is a view showing a X-ray diffraction pattern of a (001)/(100) surface of a piezoelectric layer according to the embodiment 1 of the present invention.
Figure 3:
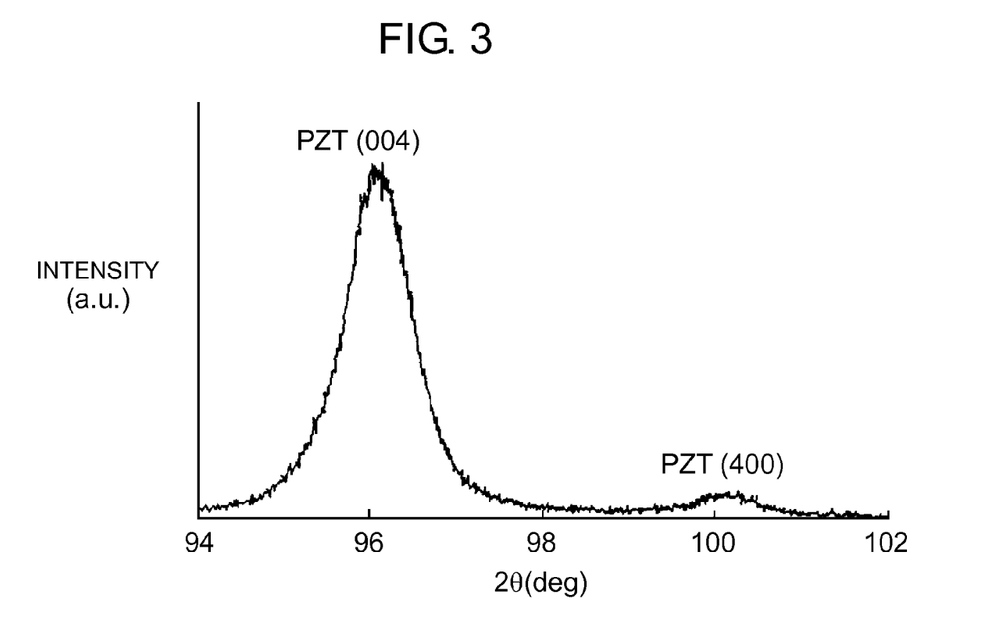
FIG. 3 is a view showing a X-ray diffraction pattern of a (004)/(400) surface of the piezoelectric layer according to the embodiment 1 of the present invention.

Here, a description will be made of an X-ray diffraction pattern of the produced piezoelectric element. FIG. 2 is a view showing an X-ray diffraction pattern of a (001)/(100) surface of the piezoelectric layer in the embodiment 1 of the present invention. FIG. 3 is a view showing an X-ray diffraction pattern of a (004)/(400) surface of the piezoelectric layer in the embodiment 1 of the present invention.

As can be seen from FIG. 2, piezoelectric layer 4 including PZT is selectively oriented only in the (001)/(100) direction of PZT. In addition, referring to FIG. 3, piezoelectric layer 4 has high selective orientation in a (004) direction serving as the polarization axis direction.

Here, when it is defined that orientation ($\alpha$ (004)) of a (004) surface is such that $\alpha$ (004)=I (004)/(I (004)+I (400)), a result is that $\alpha$ (004)=93%, which shows very excellent orientation in the (004) direction.

Thus, it can be found that orientation in a (001) direction serving as the polarization axis direction can be enhanced by applying the compressive stress to PZT. In addition, it is believed that when the compressive stress is applied to piezoelectric layer 4, the (100) oriented crystal structure is deformed to the (001) orientated structure.

Upper electrode layer 5 is formed of gold (Au) having a thickness of 0.3 μm. The material of upper electrode layer 5 is not limited to Au, and it only has to be a conductive material, and the thickness may be within a range of 0.1 to 0.5 μm.

Figure 4:
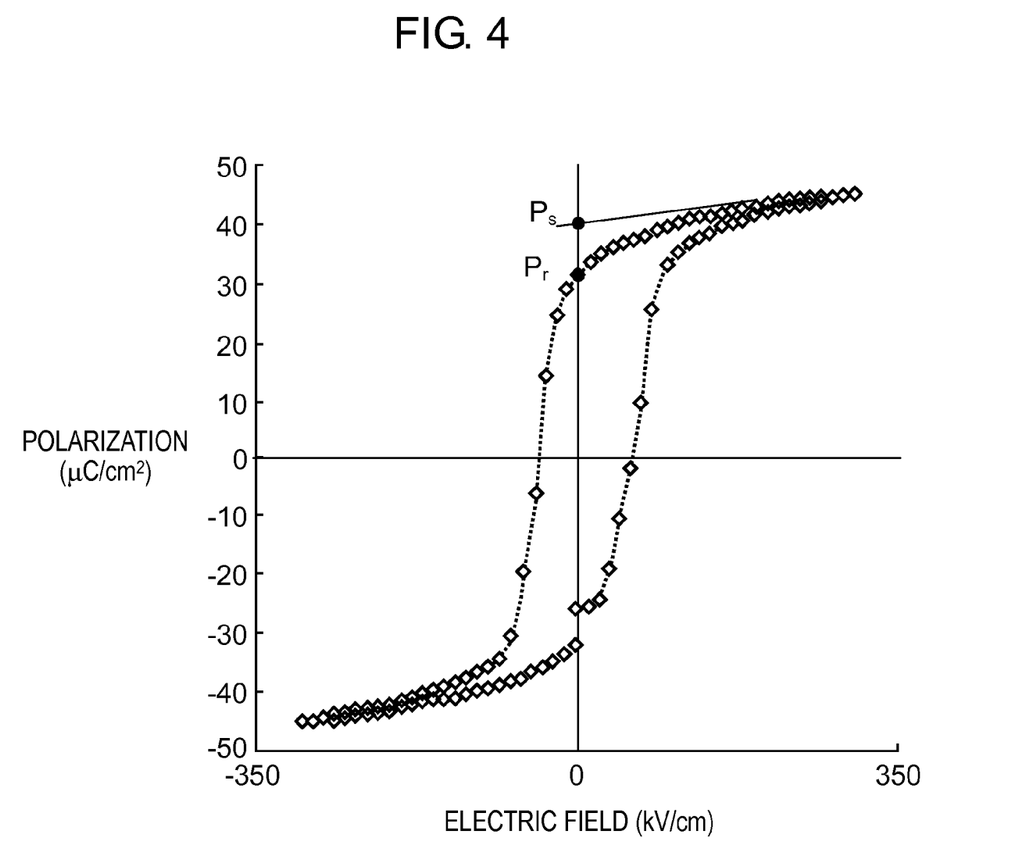
FIG. 4 is a view showing a P-E hysteresis loop of the piezoelectric element according to the embodiment 1 of the present invention.

FIG. 4 is a view showing a P-E hysteresis loop of the piezoelectric element in the embodiment 1 of the present invention. It is found that the P-E hysteresis loop is considerably excellent in squareness in FIG. 4 as compared with the conventional example in FIG. 10.

As for the conventional piezoelectric element shown in FIG. 10, when the squareness M of the P-E hysteresis loop is defined such that $M=P_r/P_s$ as the ratio of saturation polarization $P_s$ and remanent polarization $P_r$, PZT thin film 15 formed on silicon substrate 11 by the CSD method shows that M=0.55, which is a low value.

Here, when the piezoelectric element is used as a sensor and an actuator featuring a low-voltage drive, it is required to have a high piezoelectric constant and have a such property that the squareness M is preferable, that is, the M is close to 1 because the piezoelectric element is used in an electric field region not causing polarization inversion. Therefore, when the conventional piezoelectric element having the low squareness M is used in a device driven by a low voltage, it is difficult to control the device because of low proportionality of a displacement amount with respect to an applied voltage. In addition, as for the conventional piezoelectric element, since its piezoelectric property in the vicinity of 0 kV/cm is considerably lowered as compared with a high electric field region, an absolute value of the displacement amount becomes considerably small at the time of the low-voltage drive, so that a predetermined property cannot be obtained.

Meanwhile, according to the embodiment 1, when the squareness $M=P_r/P_s$ is calculated from the P-E hysteresis loop shown in FIG. 4, a result is that M=0.78, so that an extremely preferable property is obtained. That is, the piezoelectric element can implement preferable proportionality of a displacement amount with respect to an applied electric field. Furthermore, since a value of the remanent polarization $P_r$ shows a high value such that Pr=31.4 (μC/cm$^2$), the piezoelectric element can be provided to have a large absolute value of the displacement amount even at the time of the low-voltage drive.

Next, a description will be made of a method for producing the above piezoelectric element.

First, a SiO$_2$ precursor solution is applied by a spin coating method to form diffusion prevention layer 2 on substrate 1. As the SiO$_2$ precursor solution, while various kinds of solutions produced by the well-known method can be used, Si-05S produced by KOJUNDO CHEMICAL LABORATORY CO., LTD is used in the embodiment 1. This SiO$_2$ precursor solution is applied onto substrate 1 by the spin coating method. The spin coating method is performed at rotation speed of 2500 rpm for 30 seconds. The SiO$_2$ precursor solution applied on substrate 1 is dried at a temperature of 150° C. for 10 minutes, and then subjected to a primary baking treatment at 500° C. for 10 minutes. Thus, the above steps are repeated until a predetermined film thickness is obtained, whereby diffusion prevention layer 2 is formed.

Then, an LNO precursor solution is applied by the spin coating method to form lower electrode layer 3. The LNO precursor solution is applied onto diffusion prevention layer 2 by the spin coating method at rotation speed of 3500 rpm for 30 seconds.

This LNO precursor solution is prepared by a following method.

As a start raw material, lanthanum nitrate hexahydrate, and nickel acetate tetrahydrate are used, and 2-methoxyethanol and 2-aminoethanol are used as solvents. Since 2-methoxyethanol slightly contains water, it is used after its water is removed with 0.3 nm of molecular sieves.

First, lanthanum nitrate hexahydrate (La(NO$_3$)$_3$.6H$_2$O) is put into a beaker, and dried at 150° C. for one hour or more to remove hydrate. Then, it is cooled down to room temperature, and 2-methoxyethanol is added and stirred at room temperature for 3 hours to dissolve lanthanum nitrate (solution A).

Meanwhile, nickel acetate tetrahydrate ((CH$_3$COO)$_2$Ni.4H$_2$O) is put into a separate separable flask, and dried at 150° C. for 1 hour to remove hydrate, and then dried at 200° C. for 1 hour, so as to be dried for 2 hours in total. Then, 2-methoxyethanol and 2-aminoethanol are added and stirred at 110° C. for 30 minutes (solution B).

This solution B is cooled down to room temperature, and the solution A is put into the separable flask containing the solution B. These mixture is stirred at room temperature for 3 hours, whereby the LNO precursor solution is produced.

Then, the LNO precursor solution is applied onto substrate 1 and dried at 150° C. for 10 minutes to perform a dewatering process. Then, a residual organic component is thermally decomposed by a heat treatment as provisional baking at 350° C. for 10 minutes, whereby an LNO precursor thin film is produced. The step of dewatering the applied precursor solution is performed to remove physically-adsorbed water in the LNO precursor solution, and the temperature is preferably higher than 100° C. but lower than 200° C. Since the residual organic component in the LNO precursor film starts to dissolve at 200° C. or higher, the temperature is set to prevent the water from being left in the produced film. Meanwhile, the temperature in the step of producing the LNO precursor thin film in the provisional baking step to dissolve the organic substance is preferably 200° C. or more but lower than 500° C. Since crystallization of the dried LNO precursor film rapidly makes progress at 500° C. or higher, the temperature is set to prevent the organic substance from being left in the produced film.

The steps from the step of applying the LNO precursor solution onto diffusion prevention layer 2 to the step of producing the LNO precursor thin film are repeated several times. At the moment the predetermined film thickness is provided, the film is rapidly heated with an RTA (Rapid Thermal Annealing) furnace, to perform crystallization annealing. The crystallization annealing is performed at 700° C. for 5 minutes at heating-up rate of 200° C./min. The temperature of the crystallization annealing is preferably 500° C. or higher but 750° C. or lower. Then, it is cooled down to room temperature. Lower electrode layer 3 is formed through the above steps, whereby LNO is highly-oriented in the (100) direction. In order to obtain lower electrode layer 3 having the predetermined film thickness, the steps from the application step to the crystallization step may be repeated instead of repeating the steps from the application step to the thermal decomposition step and then performing the crystallization step.

Then, a PZT precursor solution to form piezoelectric layer 4 is applied onto lower electrode layer 3 by an existing application method such as a spin coating method or dip coating method. The PZT precursor solution is applied on lower electrode layer 3 by the spin coating method at rotation speed of 2500 rpm for 30 seconds.

The PZT precursor solution is prepared by a following method. Ethanol to be used in this preparation method is dehydrated ethanol which is previously subjected to a dewatering process, to prevent metal alkoxide from being hydrolyzed with contained water.

First, as a start raw material to prepare a Pb precursor solution, lead acetate (II) trihydrate ($Pb(OCOCH_3)_2 \cdot 3H_2O$) is used. This is put into a separable flask, and dried at 150° C. for 2 hours or more to remove hydrate. Then, dehydrated ethanol is added and dissolved and refluxed at 78° C. for 4 hours, whereby the Pb precursor solution is produced. As a start raw materials to prepare a Ti—Zr precursor solution, titanium isopropoxide ($Ti(OCH(CH_3)_2)_4$) and zirconium normal propoxide ($Zr(OCH_2CH_2CH_3)_4$) are used. Both of them are put into separate separable flasks and dissolved by adding dehydrated ethanol, and refluxed at 78° C. for 4 hours, whereby the Ti—Zr precursor solution is produced. A Ti/Zr ratio is weighed to implement that Ti/Zr=47/53 based on a molar ratio. The Ti—Zr precursor solution is mixed with the Pb precursor solution. At this time, the Pb component is increased by 20 mol % with respect to a stoichiometric composition ($Pb(Zr_{0.53},Ti_{0.47})O_3$). This is performed to compensate for the shortfall due to volatilization of a zinc component at the time of annealing. The mixture solution is refluxed at 78° C. for 4 hours, and acetylacetone is added as a stabilizer, by 0.5 mol equivalent with respect to a total amount of metal positive ions, and further refluxed at 78° C. for 1 hour, whereby the PZT precursor solution is produced.

Next, the PZT precursor solution is applied onto lower electrode layer 3 and dried at 115° C. for 10 minutes to perform a dewatering process. Then, a residual organic component is thermally decomposed by a heat treatment as a provisional baking at 350° C. for 10 minutes, whereby a PZT precursor thin film is produced.

The step of dewatering the applied PZT precursor solution is performed to remove physically-adsorbed water in the PZT precursor solution, and the temperature is preferably higher than 100° C. but lower than 200° C. Since the residual organic component in the PZT precursor film starts to dissolve at 200° C. or higher, the temperature is set to prevent the water from being left in the produced film. Meanwhile, the temperature in the step of producing the PZT precursor thin film in the provisional baking step to dissolve the organic substance is preferably 200° C. or more but lower than 500° C. This is because crystallization of the dried PZT precursor film rapidly makes progress at 500° C. or higher, and the temperature is set to prevent the organic component from being left in the produced film.

The steps from the step of applying the PZT precursor solution onto lower electrode layer 3 to the step of producing the PZT precursor thin film are repeated several times. At the moment the predetermined film thickness is provided, the film is rapidly heated with a RTA (Rapid Thermal Annealing) furnace using a lamp heater, to perform crystallization annealing. The crystallization annealing is performed at 650° C. for 5 minutes at heating-up rate of 200° C./min. The temperature of the crystallization annealing is preferably 500° C. or higher but 750° C. or lower. When the temperature is 750° C. or higher, Pb contained in the film is insufficient because the Pb evaporates at the time of forming the PZT film, so that a crystalline property is lowered. After the crystallization annealing step, it is cooled down to room temperature, whereby piezoelectric layer 4 is formed. In order to obtain piezoelectric layer 4 having the predetermined film thickness, steps from the application step to the crystallization step may be repeated instead of repeating the steps from the application step to the thermal decomposition step and performing the crystallization step. Through the above steps, the PZT thin film highly oriented in the (001) direction can be provided.

Finally, upper electrode layer 5 including Au is formed on piezoelectric layer 4 by an ion beam deposition method. The method for forming upper electrode layer 5 is not limited to the ion beam deposition method, and a resistance heating deposition method, or a sputtering method may be used.

According to the embodiment 1, since piezoelectric layer 4 including PZT is formed on lower electrode layer 3 including LNO, considerably high crystalline orientation can be obtained as compared with the case where it is formed on the Pt electrode like in the conventional piezoelectric element.

Figure 5:
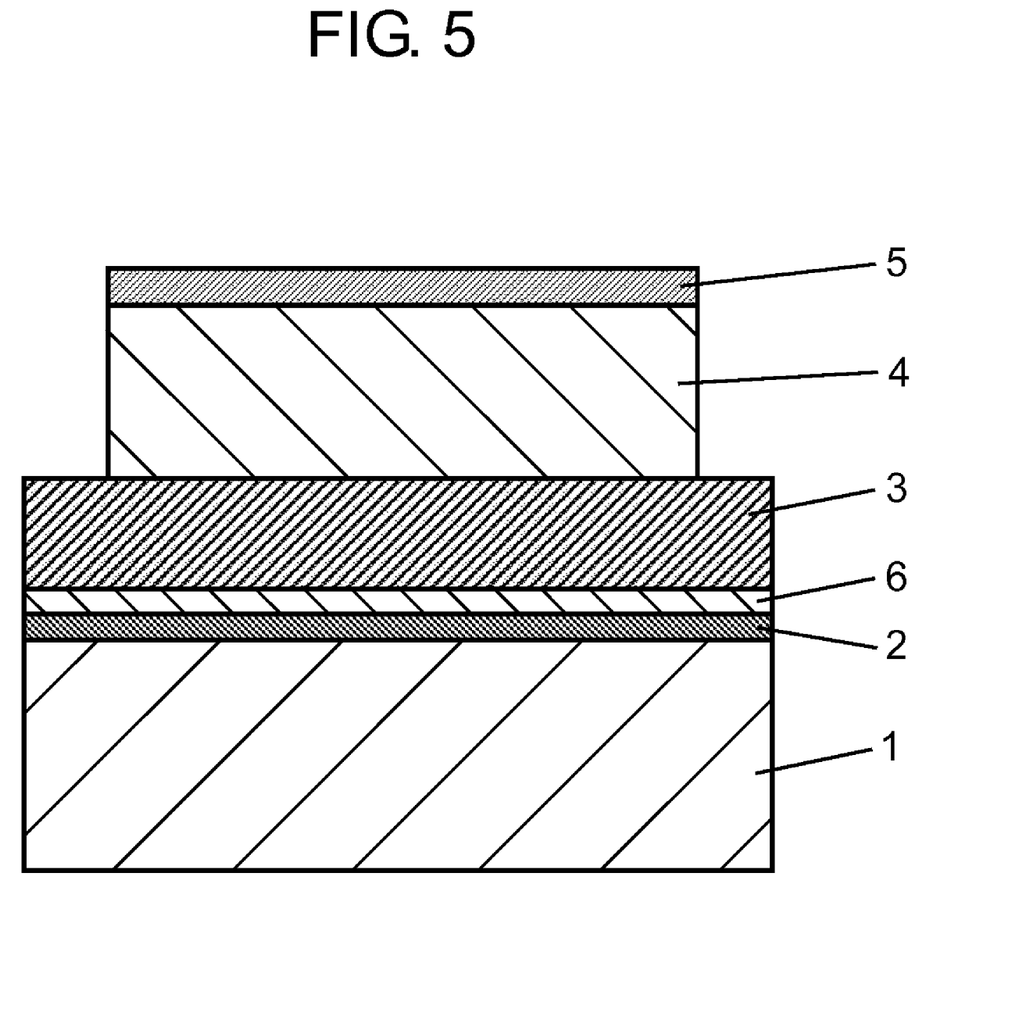
FIG. 5 is a cross-sectional view of a piezoelectric element provided with a highly conductive layer according to the embodiment 1 of the present invention.

FIG. 5 is a cross-sectional view of a piezoelectric element having a highly conductive layer in the embodiment 1 of the present invention. When the piezoelectric element is used in a device having electric conductivity further higher than that of LNO, highly conductive layer 6 may be formed between lower electrode layer 3 and diffusion prevention layer 2 as shown in FIG. 5. Highly conductive layer 6 is preferably formed of a noble metal material or a noble metal oxide such as platinum, ruthenium, iridium, rhenium, ruthenium oxide, iridium oxide, or rhenium oxide.

In addition, according to the embodiment 1, since diffusion prevention layer 2, lower electrode layer 3, and piezoelectric layer 4 are formed by the CSD method, there is no need to perform a vacuum process which is needed in a vapor phase growth method such as the sputtering method, so that a cost can be cut. Since LNO used in lower electrode layer 3 can be self-oriented in the (100) direction by being produced through the above production method, the orientation direction is not likely to depend on the material of substrate 1. Therefore, the material of substrate 1 is not limited. Thus, according to the embodiment 1, a certain material can be selected for substrate 1, in view of a thermal expansion coefficient and fracture toughness.

Furthermore, according to the embodiment 1, since substrate 1 can include various kinds of materials such as the stainless steel material having the high fracture toughness, its reliability can be enhanced as compared with the conventional case using the Si substrate which is a brittle material. Therefore, the piezoelectric element according to the present invention is suitable for a device which repeats oscillation, such as a sensor or an actuator. When a defect such as a fine crack is generated in the silicon substrate in the production step, the substrate could be fractured from that point. As compared with this, the material having high fracture toughness according to the embodiment 1 can be considerably prevented from being fractured, so that a production yield of the device can be improved. Furthermore, the stainless steel material is very inexpensive as compared with the Si substrate, so that a substrate cost can be reduced to about 1/10.

In addition, according to the embodiment 1, since the polycrystalline material is used for piezoelectric layer 4, fracture resistance against the oscillation can be improved as compared with the case using a single crystalline material. This is because a bonding force in the in-plane direction of the substrate is strong in the case of the single crystalline material, so that the stress due to the oscillation cannot be relaxed and the substrate is likely to be fractured, but in the case of the polycrystalline material, since a grain boundary exists in the in-plane direction, the stress can be relaxed.

In addition, while the RTA furnace is used in the crystallization annealing step in the embodiment 1, substrate 1 can be prevented from being oxidized by setting a heating atmosphere to an inert atmosphere. In addition, when a halogen lamp used in the RTA furnace is formed only on the surface side of piezoelectric layer 4, the heat is only applied from the surface side of piezoelectric layer 4, and substrate 1 is prevented from being heated, so that substrate 1 can be prevented from being oxidized.

Furthermore, the heating furnace for the crystallization annealing is not limited to the RTA furnace, and a laser annealing may be used. When the laser annealing is used, it is desirable that substrate 1 is sufficiently heated when a compressive stress is applied to piezoelectric layer 4, and an atmosphere furnace is used together.

In addition, while piezoelectric layer 4 is formed by the CSD method in the embodiment 1, but the method is not limited thereto, various kinds of film forming methods such as an aerosol deposition method (AD method), sputtering method, CVD method may be used instead.

When the AD method is used, piezoelectric layer 4 can be produced such that the high crystalline orientation is realized, and the compressive stress is applied thereto by forming an oxide film including the composition of piezoelectric layer 4 on lower electrode layer 3 in a film forming chamber at room temperature, and then heating the resultant in the same manner as the crystallization annealing performed by the CSD method. When the sputtering method or CVD method is used, piezoelectric layer 4 can be produced such that the high crystalline orientation is realized, and the compressive stress is applied thereto by previously heating substrate 1 when a film is formed in a chamber.

In addition, while diffusion prevention layer 2 is formed in the embodiment 1, diffusion prevention layer 3 may not be used when element diffusion from substrate 1 or piezoelectric layer 4 is not generated in the production step, and lower electrode layer 3 may be directly formed on substrate 1.

Furthermore, while LNO is used for lower electrode layer 3 in the embodiment 1, the material is not limited thereto and various conductive oxide crystalline bodies may be used instead of that material, and especially a perovskite conductive oxide is desirable. For example, the perovskite oxide may be the one mostly including strontium ruthenate or lanthanum-strontium-cobalt oxide which is preferentially oriented in a (100) direction in a pseudo-cubic system. In these cases also, by setting a lattice constant of a main oriented surface to be within ±10% of a lattice constant of a main orientated surface of piezoelectric layer 4, the orientation in the (001)/(100) direction of piezoelectric layer 4 can be enhanced. Thus, by applying the compressive stress to piezoelectric layer 4, the orientation in the (001) direction which is the polarization axis direction of piezoelectric layer 4 can be enhanced.

(Embodiment) 2

Hereinafter, a piezoelectric element according to an embodiment 2 of the present invention will be described with reference to the drawings. A main configuration of the embodiment 2 is the same as that of the embodiment 1. As for the same configuration as that of the first embodiment 1, its description is omitted and a different point will be described.

According to the embodiment 2, with a view to further enhance the piezoelectric property, SUS430 of ferritic stainless steel defined in JIS is used as substrate 1 on which a piezoelectric element is formed. While a linear thermal expansion coefficient of SUS430 is $105\times10^{-7}/°$ C., a linear thermal expansion coefficient of PZT serving as piezoelectric layer 4 is $79\times10^{-7}/°$ C. Since SUS430 has the higher linear thermal expansion coefficient, PZT has a residual compressive stress. However, since the linear thermal expansion coefficient is smaller than that of SUS304, it is believed that the compressive stress to PZT is smaller than the case where SUS304 substrate is used.

Figure 6:
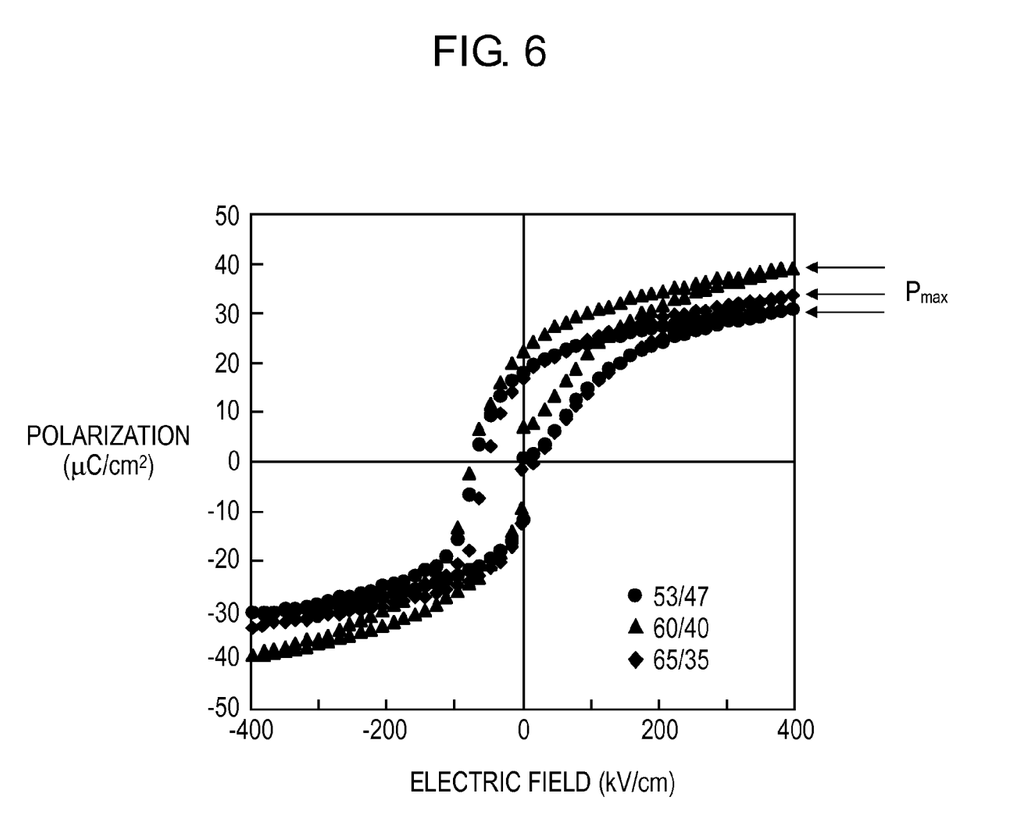
FIG. 6 is a view showing P-E hysteresis loops of a piezoelectric element according to an embodiment 2 of the present invention.

FIG. 6 is a view showing P-E hysteresis loops of the piezoelectric element according to the embodiment 2 of the present invention. Piezoelectric layer 4 includes (001) oriented PZT having a rhombohedral system or a tetragonal system. In FIG. 6, PZT has three different compositions (Zr/Ti=53/47, 60/40, and 65/35) in the vicinity of a boundary (Morphotropic phase boundary) between the rhombohedral system and the tetragonal system.

As can be clear from FIG. 6, preferable hysteresis curves having less leakage current are provided. A maximum polarization values at this time (Pmax: polarization values at the time of 400 kV/cm) are 31 $\mu C/cm^2$ (53/47), 40 $\mu C/cm^2$ (60/40), and 33 $\mu C/cm^2$ (65/35). Their relative dielectric constants are 430 (53/47), 620 (60/40), and 590 (65/35). Thus, it is found that especially when the Zr/Ti ratio is 60/40, the maximum polarizability and the relative dielectric constant are high and thus the dielectric/ferroelectric property is preferable. As for a piezoelectric constant, a high value which is about twice as high as that of the PZT thin film on the SUS304 substrate is obtained.

In addition, the Zr/Ti compositions in piezoelectric layer 4 are not limited to such that Zr/Ti=53/47, 60/40, and 65/35, it may be such that Zr/Ti=30/70 to 70/30. Furthermore, the Zr/Ti compositions is preferable that Zr/Ti=50/50 to 70/30.

(Embodiment) 3

Hereinafter, a piezoelectric element according to an embodiment 3 of the present invention will be described with reference to the drawings. A main configuration of the embodiment 3 is the same as that of the embodiment 1. As for the same configuration as that of the first embodiment 1, its description is omitted and a different point will be described.

According to the embodiment 3, SUS304 is used for substrate 1, and a surface configuration of substrate 1 is a rough surface.

Here, warpages of the substrate before film formation, after an annealing treatment before the film formation, and after the film formation are compared by used of a curvature radius R of the substrate. The fact that an absolute amount of the curvature radius is large means that a warpage amount is small. Meanwhile, the fact that the absolute amount of the curvature radius is small means that a warpage amount is large.

A working example uses a SUS304 substrate as substrate 1 having a thickness of 0.2 mm, and having a rough surface whose surface roughness (Ra) is 93 nm. In addition, a comparison example uses a SUS304 substrate as substrate 1 having a thickness of 0.2 nm, and having a mirror surface whose surface roughness (Ra) is 30 nm. Table 1 shows a result of performance comparison between the working example and the comparison example. The result is defined assuming that the curvature radius of the substrate before the film formation is infinite (∞).

TABLE 1

| SAMPLE | Ra (nm) | STEP | R (mm) |
|---|---|---|---|
| WORKING EXAMPLE (ROUGH SURFACE) t = 0.2 mm | 93 | BEFORE FILM FORMATION | ∞ |
| | | ANNEALING PROCESS TO SUBSTRATE ON WHICH FILM IS NOT FORMED | 25318 |
| | | AFTER FILM FORMATION | −14054 |
| COMPARISON EXAMPLE (MIRROR SURFACE) t = 0.2 mm | 30 | BEFORE FILM FORMATION | ∞ |
| | | ANNEALING PROCESS TO SUBSTRATE ON WHICH FILM IS NOT FORMED | 45383 |
| | | AFTER FILM FORMATION | 139 |

Based on the result in the table 1, when the substrate on which the film is not formed is only subjected to the annealing treatment, the curvature radiuses are very large in both of the working example and the comparison example. That is, it can be found that it is highly unlikely that the substrate is warped due to the annealing treatment. Meanwhile, when the substrate on which the film is formed is measured, it is found that the curvature radius is large in the working example while the curvature radius is small in the comparison example. That is, a warpage amount can be reduced in the case where the film is formed on the substrate having the rough surface, as compared with the case where the film is formed on the substrate having the mirror surface.

Figure 7:
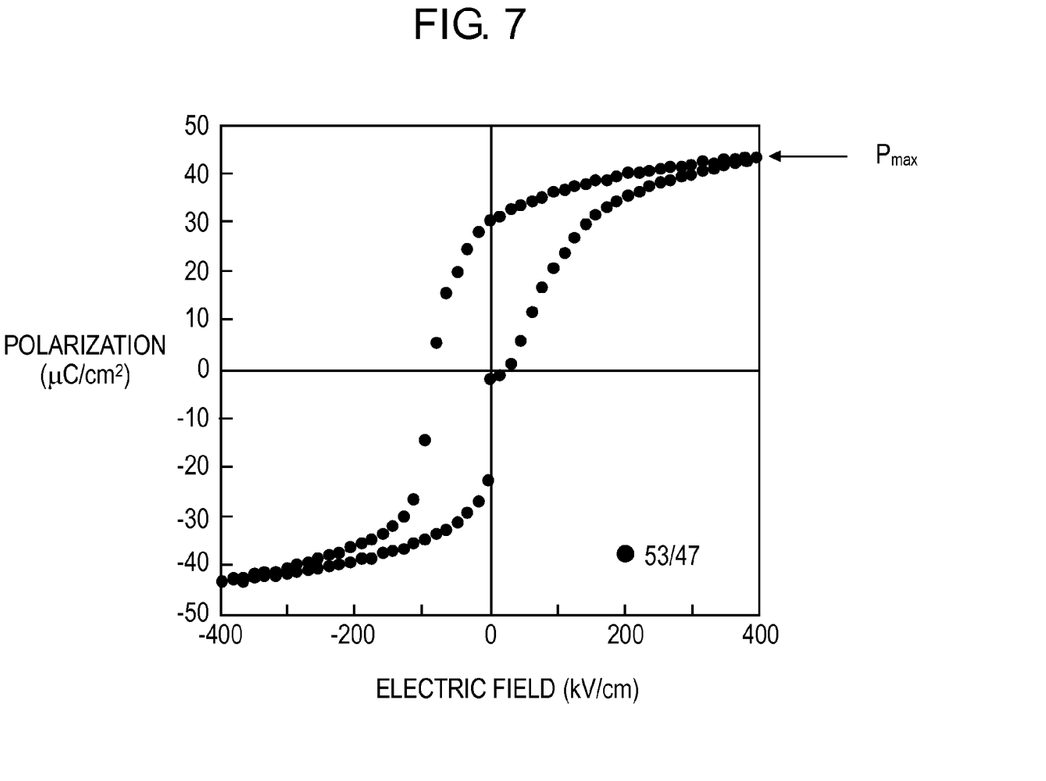
FIG. 7 is a view showing a P-E hysteresis loop of a piezoelectric element according to an embodiment 3 of the present invention.

FIG. 7 is a view showing a P-E hysteresis loop of the piezoelectric element according to the embodiment 3 of the present invention. In addition, a Zr/Ti composition in piezoelectric layer 4 is such that Zr/Ti=53/47. As can be seen from FIG. 7, even when the surface of substrate 1 is the rough surface, a preferable hysteresis curve can be obtained.

(Embodiment) 4

Hereinafter, a piezoelectric element according to an embodiment 4 of the present invention will be described with reference to the drawings. As for the same configuration as that of the first embodiment 1, its description is omitted and a different point will be described.

Figure 8:
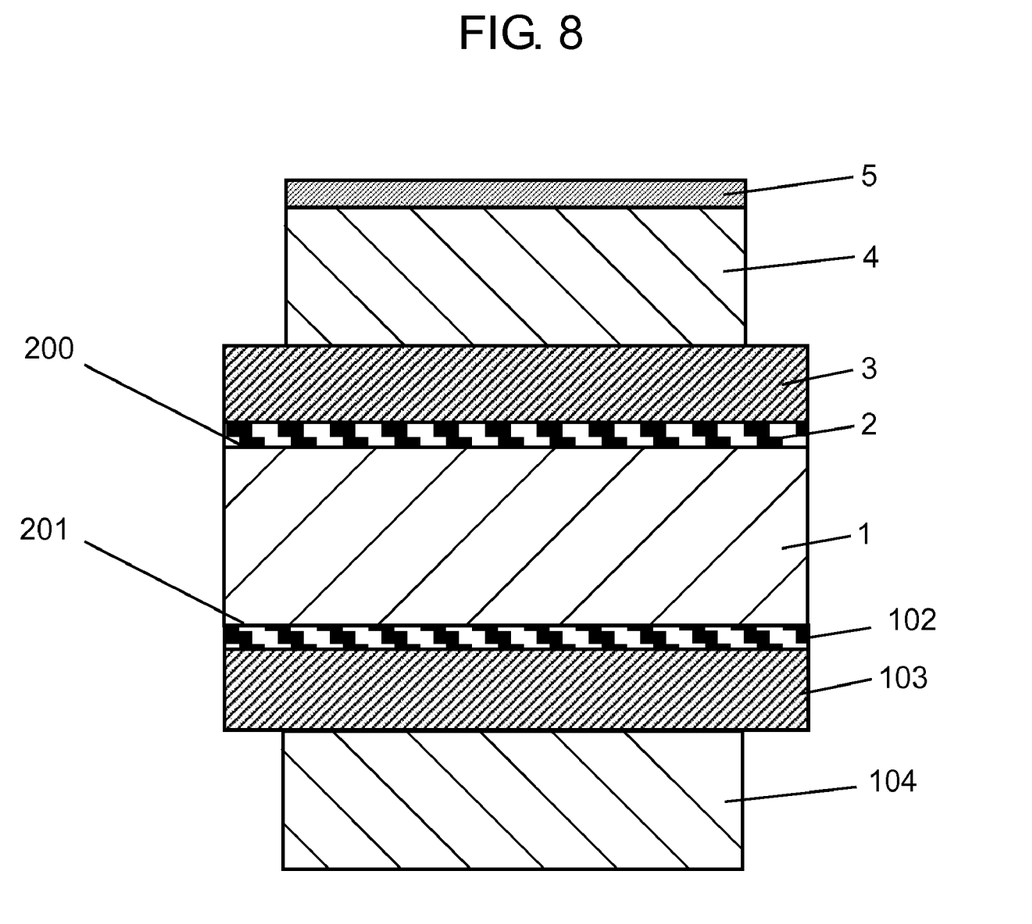
FIG. 8 is a cross-sectional view of a piezoelectric element according to an embodiment 4 of the present invention.

According to the embodiment 4, piezoelectric layer 104 is further formed on a second surface opposed to a first surface across substrate 1 on which lower electrode layer 3 and piezoelectric layer 4 are formed.

FIG. 8 is a cross-sectional view of the piezoelectric element according to the embodiment 4 of the present invention. Referring to FIG. 8, the piezoelectric element is provided such that diffusion prevention layer 2, lower electrode layer 3, piezoelectric layer 4, and upper electrode layer 5 are sequentially formed on first surface 200 of substrate 1. Furthermore, diffusion prevention layer 102, lower electrode layer 103, and piezoelectric layer 104 are sequentially formed on second surface 201 opposed to first surface 200 across substrate 1.

Substrate 1 can include a material having a linear thermal expansion coefficient and fracture toughness higher than that of piezoelectric layers 4 and 104. There are various kinds of materials such as a stainless steel material, or a metal material such as aluminum or magnesium.

Diffusion prevention layers 2 and 102 are provided to prevent mutual diffusion of components between substrate 1 and piezoelectric layers 4 and 104, and they preferably include an oxide material having no crystal grain boundary of silicon dioxide or titanium dioxide.

Lower electrode layers 3 and 103 include a material mostly including LNO. LNO has a perovskite structure. Piezoelectric layers 4 and 104 are polycrystalline bodies each having an in-plane compressive stress.

Steps of forming diffusion prevention layer 102, lower electrode layer 103, and piezoelectric layer 104 on second surface 201 are performed using steps of forming the same layers on first surface 200. For example, the step of forming piezoelectric layer 104 includes a step of applying a precursor solution on the substrate, an annealing step of crystallizing the precursor solution under the condition that the substrate is heated, and a cooling step.

When the steps are the same on first surface 200 and second surface 201, there is a feature of being capable of performing the steps under the same condition at the same time, basically. Thus, working efficiency can be improved in the steps of forming the layers.

Regarding the piezoelectric element produced as described above, piezoelectric layer 4 has an in-plane compressive stress, and crystalline orientation is improved. As a result, linearity of a displacement amount is excellent with respect to an applied voltage.

Furthermore, when piezoelectric layer 104 is provided on second surface 201 opposed to first surface 200, compressive stresses of two piezoelectric layers 4 and 104 are balanced to prevent warpage of the piezoelectric element.

In addition, when piezoelectric layer 4 on first surface 200 and piezoelectric layer 104 on second surface 201 are provided so as to have the same composition and the same film thickness, warpage is hardly generated in a center surface of substrate 1, and the piezoelectric element is prevented from being warped.

In addition, the description has been made of the case where diffusion prevention layer 102, lower electrode layer 103, and piezoelectric layer 104 are formed on second surface 201 of substrate 1 in the embodiment 4. However, when at least piezoelectric layer 104 is formed on second surface 201, it has an effect of balancing the compressive stress with piezoelectric layer 4 on first surface 200.

Industrial Applicability

According to a piezoelectric element and a method for producing the same in the present invention, the piezoelectric element can be formed so as to be preferable in proportionality of a displacement amount with respect to an applied voltage, and show an excellent piezoelectric property. Therefore, the piezoelectric element according to the present invention can be effectively used for various kinds of sensors such as an angular velocity sensor, and an infrared sensor, various kinds of actuators such as a piezoelectric actuator, and an ultrasonic motor, and optical devices such as an optical switch and an optical scanner, used in various kinds of electronic equipments.

| REFERENCE MARKS IN THE DRAWINGS | |
|---|---|
| 1 | SUBSTRATE |
| 2 | DIFFUSION PREVENTION LAYER |
| 3 | LOWER ELECTRODE LAYER |
| 4 | PIEZOELECTRIC LAYER |
| 5 | UPPER ELECTRODE LAYER |
| 6 | HIGHLY CONDUCTIVE LAYER |
| 11 | SILICON SUBSTRATE |
| 12 | THERMALLY OXIDIZED FILM |
| 13 | TI FILM |
| 14 | PT THIN FILM |
| 15 | PZT THIN FILM |

The invention claimed is:

1. A piezoelectric element comprising:
a substrate;
a lower electrode layer formed on the substrate;
a piezoelectric layer formed on the lower electrode layer; and
an upper electrode layer formed on the piezoelectric layer, wherein
the lower electrode layer includes a conductive oxide crystalline body,
the substrate has a linear thermal expansion coefficient higher than that of the piezoelectric layer, and
the piezoelectric layer is a polycrystalline body having an in-plane compressive stress.

2. The piezoelectric element according to claim 1, wherein the piezoelectric layer is formed by a chemical solution deposition method.

3. The piezoelectric element according to claim 1, wherein the substrate has fracture toughness higher than that of the piezoelectric layer.

4. The piezoelectric element according to claim 1, wherein the lower electrode layer is a perovskite type.

5. The piezoelectric element according to claim 1, wherein a difference between a lattice constant of a main oriented surface of the lower electrode layer and a lattice constant of a main oriented surface of the piezoelectric layer is within ±10%.

6. The piezoelectric element according to claim 1, wherein the piezoelectric layer includes a perovskite oxide ferroelectric body provided such that a surface vertical to the substrate is preferentially oriented in a polarization axis direction, and a surface parallel to the substrate is randomly oriented.

7. The piezoelectric element according to claim 1, wherein the substrate includes a metal material.

8. The piezoelectric element according to claim 1, wherein a highly conductive layer having resistivity lower than that of the lower electrode layer is formed under the lower electrode layer.

9. The piezoelectric element according to claim 1, wherein the substrate has a rough surface.

10. The piezoelectric element according to claim 1, wherein
a surface state of the substrate has a surface roughness Ra of 90 nm or more.

11. The piezoelectric element according to claim 1, wherein
a piezoelectric layer is further formed on a second surface opposed to a first surface across the substrate having the lower electrode layer, and the piezoelectric layer
the substrate has a linear thermal expansion coefficient higher than that of the piezoelectric layer on the second surface, and the piezoelectric layer on the second surface includes a polycrystalline body having an in-plane stress.

12. The piezoelectric element according to claim 11, wherein
the piezoelectric layer on the second surface is formed on the second surface through the lower electrode layer.

* * * * *